United States Patent
Kubota et al.

(10) Patent No.: US 9,633,862 B2
(45) Date of Patent: Apr. 25, 2017

(54) SEMICONDUCTOR MANUFACTURING APPARATUS AND SEMICONDUCTOR MANUFACTURING METHOD

(71) Applicant: Kabushiki Kaisha Toshiba, Minato-ku (JP)

(72) Inventors: Atsushi Kubota, Kuwana (JP); Takashi Ohashi, Yokkaichi (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/017,018

(22) Filed: Feb. 5, 2016

(65) Prior Publication Data

US 2017/0062226 A1    Mar. 2, 2017

Related U.S. Application Data

(60) Provisional application No. 62/212,280, filed on Aug. 31, 2015.

(51) Int. Cl.
  *H01L 21/3065*    (2006.01)
  *H01L 21/67*      (2006.01)
  *H01L 21/02*      (2006.01)
  *H01L 21/66*      (2006.01)

(52) U.S. Cl.
  CPC .... *H01L 21/3065* (2013.01); *H01L 21/02002* (2013.01); *H01L 21/02035* (2013.01); *H01L 21/67288* (2013.01); *H01L 22/12* (2013.01)

(58) Field of Classification Search
  None
  See application file for complete search history.

(56) References Cited

U.S. PATENT DOCUMENTS

| | | | | |
|---|---|---|---|---|
| 5,474,642 A | * | 12/1995 | Zorina | C23C 16/513 118/723 ER |
| 6,004,631 A | * | 12/1999 | Mori | H01J 37/32366 134/1.2 |
| 6,502,588 B2 | * | 1/2003 | Li | C03C 23/006 134/1.1 |
| 6,936,546 B2 | | 8/2005 | Robbins | |

(Continued)

FOREIGN PATENT DOCUMENTS

JP   2005-524235    8/2005
JP   2007-299881   11/2007

(Continued)

*Primary Examiner* — Allan Olsen
(74) *Attorney, Agent, or Firm* — Oblon, McClelland, Maier & Neustadt, L.L.P.

(57) ABSTRACT

A semiconductor manufacturing apparatus according to an embodiment includes a reactor, a mover, and a controller. The reactor houses an outer edge portion of a semiconductor substrate in inside thereof through a gap portion and scrapes the outer edge portion. The mover moves at least either the semiconductor substrate or end faces of the gap portion in a thickness direction of the semiconductor substrate to change distances in the thickness direction between the semiconductor substrate and the end faces of the gap portion. The controller controls a movement amount in the thickness direction of at least either the semiconductor substrate or the end faces of the gap portion according to a warp amount of the outer edge portion in the thickness direction.

8 Claims, 12 Drawing Sheets

(56) References Cited

U.S. PATENT DOCUMENTS

| | | | |
|---|---|---|---|
| 7,404,874 B2* | 7/2008 | America | B08B 7/0035 |
| | | | 118/723 E |
| 7,491,344 B2* | 2/2009 | Park | H01J 37/32055 |
| | | | 216/71 |
| 7,591,957 B2* | 9/2009 | Carr | B23K 1/206 |
| | | | 216/24 |
| 7,718,542 B2* | 5/2010 | Kim | H01L 21/02087 |
| | | | 134/1.2 |
| 7,858,053 B2 | 12/2010 | Imai | |
| 7,858,898 B2 | 12/2010 | Bailey, III et al. | |
| 7,977,123 B2 | 7/2011 | Fischer et al. | |
| 8,329,593 B2 | 12/2012 | Yousif et al. | |
| 8,475,624 B2* | 7/2013 | Sexton | B08B 7/0035 |
| | | | 156/345.3 |
| 8,580,078 B2* | 11/2013 | Bailey, III | H01L 21/02087 |
| | | | 118/728 |
| 8,864,936 B2* | 10/2014 | Han | H01J 37/20 |
| | | | 118/723 E |
| 2003/0203650 A1 | 10/2003 | Robbins | |
| 2004/0157461 A1* | 8/2004 | Kononchuk | H01L 21/3065 |
| | | | 438/710 |
| 2005/0173067 A1* | 8/2005 | Lim | H01J 37/32091 |
| | | | 156/345.32 |
| 2007/0251919 A1 | 11/2007 | Imai | |
| 2009/0156013 A1 | 6/2009 | Yousif et al. | |
| 2010/0212833 A1* | 8/2010 | Chang | H01J 37/32642 |
| | | | 156/345.43 |
| 2016/0099162 A1* | 4/2016 | Ng | H01L 21/32136 |
| | | | 269/302 |

FOREIGN PATENT DOCUMENTS

| | | |
|---|---|---|
| JP | 2009-176991 | 8/2009 |
| JP | 2011-523501 | 8/2011 |
| JP | 5248526 | 7/2013 |
| JP | 5622077 | 11/2014 |
| JP | 5629762 | 11/2014 |

* cited by examiner

SEMICONDUCTOR MANUFACTURING APPARATUS AND SEMICONDUCTOR MANUFACTURING METHOD

CROSS REFERENCE TO RELATED APPLICATIONS

This application is based upon and claims the benefit of priority from the prior U.S. Provisional Patent Application No. 62/212,280 filed on Aug. 31, 2015, the entire contents of which are incorporated herein by reference.

FIELD

Embodiments relate to a semiconductor manufacturing apparatus and a semiconductor manufacturing method.

BACKGROUND

A bevel etching apparatus that etches a bevel of the outer edge portion of a wafer is conventionally used in a manufacturing process of a semiconductor device. In the bevel etching apparatus, the bevel is etched with plasma generated in a chamber. By etching the bevel, unwanted portions such as particles can be removed from the bevel that is not managed in a film forming process.

However, the conventional bevel etching apparatus does not sufficiently consider a positional relation between the bevel and the chamber depending to a warp amount of the bevel. Accordingly, when the bevel warps greatly, there is a fear that the bevel hits the chamber, which leads to difficulty in appropriate bevel etching.

DETAILED DESCRIPTION

A semiconductor manufacturing apparatus according to an embodiment includes a reactor, a mover, and a controller. The reactor houses an outer edge portion of a semiconductor substrate in inside thereof through a gap portion and scrapes the outer edge portion. The mover moves at least either the semiconductor substrate or end faces of the gap portion in a thickness direction of the semiconductor substrate to change distances in the thickness direction between the semiconductor substrate and the end faces of the gap portion. The controller controls a movement amount in the thickness direction of at least either the semiconductor substrate or the end faces of the gap portion according to a warp amount of the outer edge portion in the thickness direction.

Embodiments will now be explained with reference to the accompanying drawings. The present invention is not limited to the embodiments.

First Embodiment

An embodiment of a semiconductor manufacturing apparatus that moves a semiconductor substrate in a direction of the thickness of the semiconductor substrate is explained first as a first embodiment.

Figure 1:
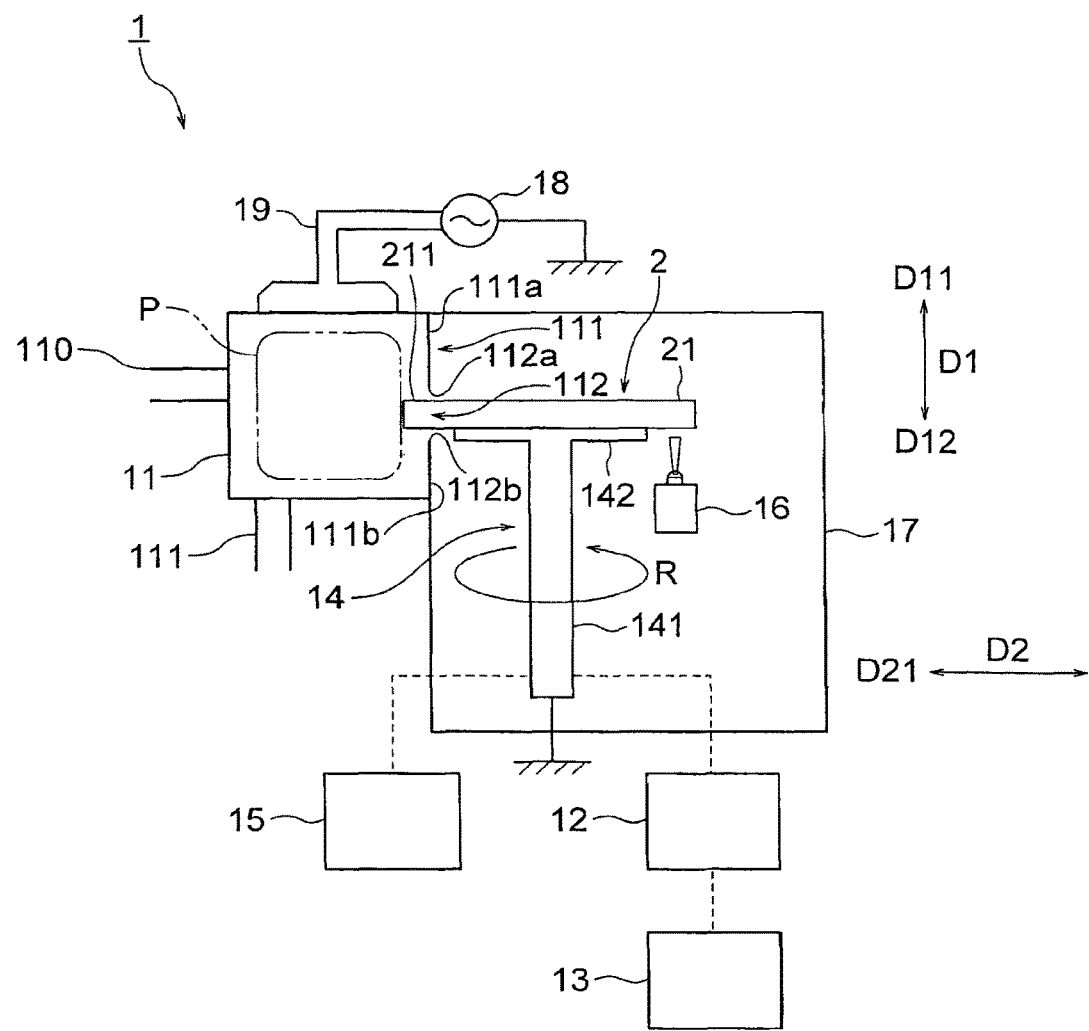
FIG. 1 is a schematic cross-sectional view showing a semiconductor manufacturing apparatus according to a first embodiment.
Figure 2:
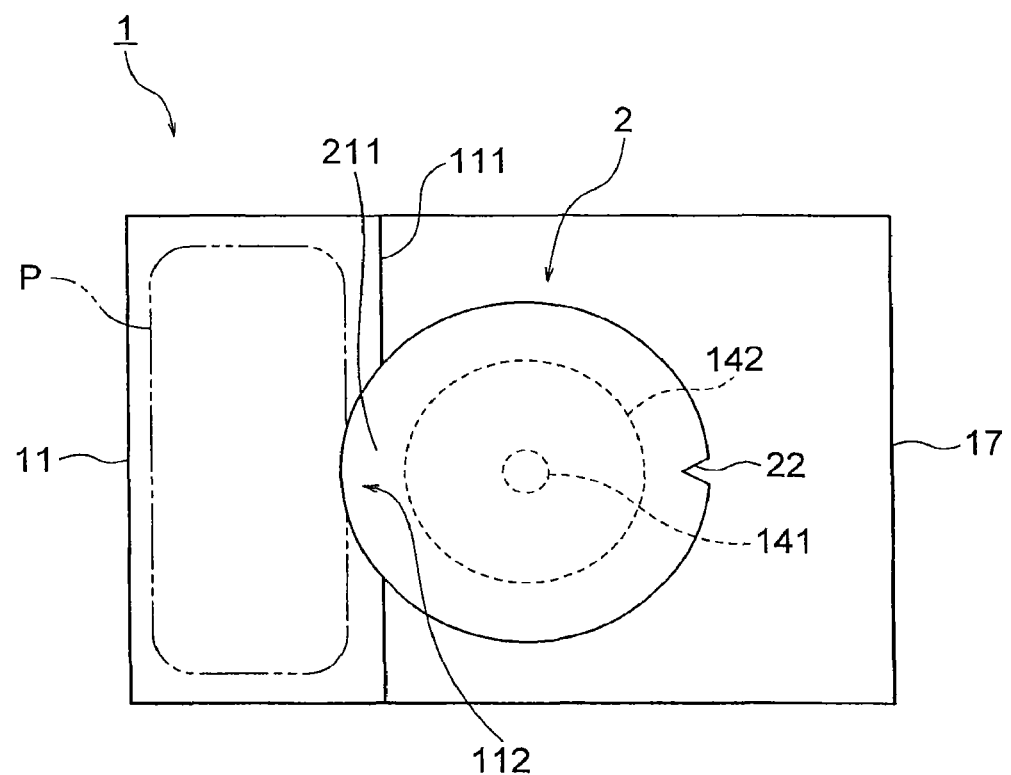
FIG. 2 is a schematic plan view showing the semiconductor manufacturing apparatus according to the first embodiment.

FIG. 1 is a schematic cross-sectional view showing a semiconductor manufacturing apparatus 1 according to the first embodiment. FIG. 2 is a schematic plan view showing the semiconductor manufacturing apparatus 1 according to the first embodiment. The semiconductor manufacturing apparatus 1 in FIG. 1 is, for example, a vacuum-plasma bevel etching apparatus.

As shown in FIG. 1, the semiconductor manufacturing apparatus 1 includes a reacting device 11, that is, a chamber as an example of a reactor, a mover 12, a controller 13, a support body 14 as an example of a supporter, a rotator 15, and a detecting sensor 16 as an example of a detector. The semiconductor manufacturing apparatus 1 also includes a vacuum device 17, a microwave oscillator 18, and a waveguide 19.

(Reacting Device 11)

The reacting device 11 is formed to be hollow and has a sidewalk 111 that separates the inside of the reacting device 11 and outside thereof from each other. The sidewall 111 separates the inside of the reacting device 11 and the inside of the vacuum device 17 from each other. The inside of the reacting device 11 and the inside of the vacuum device 17 are maintained in a vacuum state by a vacuum pump (not shown).

A gap portion 112 that causes the inside of the reacting device 11 and the inside of the vacuum device 17 to be communicated with each other is formed in the sidewall 111. The gap portion 112 is formed linearly along the sidewall 111 of a flat plate shape.

The reacting device 11 houses an outer edge portion 21 of a semiconductor substrate 2 in the inside of the reacting device 11 through the gap portion 112. More specifically, the reacting device 11 houses a first outer edge portion 211 of the outer edge portion 21 of an annular shape, which is in a certain range of the entire periphery of the outer edge portion 21. As will be explained later, the first outer edge portion 211 changes with rotation of the support body 14 that supports the semiconductor substrate 2. Therefore, the reacting device 11 can house the entire region of the outer edge portion 21 in turn.

The waveguide 19 is connected to the reacting device 11. The microwave oscillator 18 is connected to the waveguide 19. A supply pipe 110 and a discharge pipe 111 for gas G for plasma generation are also connected to the reacting device 11. A microwave is supplied to the inside of the reacting device 11 from the microwave oscillator 18 via the waveguide 19. The gas G for plasma generation is also supplied to the inside of the reacting device 11. The gas G is excited with the microwave on the surface of a dielectric (not shown) in the inside of the reacting device 11, so that surface wave plasma P is generated in the inside of the reacting device 11. Due to the generated plasma P, the first outer edge portion 211 exposed to the plasma P is etched (scraped). Etching can remove unwanted portions such as particles from the first outer edge portion 211.

(Support Body 14, Rotator 15)

The support body 14 is placed in the inside of the vacuum device 17. The support body 14 includes a support rod 141 that can extend in a vertical direction D1, and a horizontal stage 142 provided on an upper end of the support rod 141. The support body 14 horizontally holds the semiconductor substrate 2, for example, to be stuck onto the stage 142 with a vacuum chuck. The support body 14 is held in the vacuum device 17 to be capable of rotating around the support rod 141 as shown by a rotation direction R in FIG. 1. The support body 14 is held in the vacuum device 17 to also be capable of moving in the vertical direction D1 and a horizontal direction D2.

The rotator 15 is connected to the support body 14. The rotator 15 rotates the support body 14 in a state of holding the semiconductor substrate 2 in the rotation direction R. Rotation of the support body 14 causes respective places of the outer edge portion 21 of the semiconductor substrate 2 to be housed in the inside of the reacting device 11 in turn as the first outer edge portion 211 and etched. The rotator 15 can include, for example, a motor and a driving-force transmission member such as a gear that transmits a rotating force of the motor to the support body 14.

(Mover 12)

The mover 12 is connected to the support body 14. The mover 12 moves the support body 14 together with the semiconductor substrate 2 in the vertical direction D1 (hereinafter, also "thickness direction D1" of the semiconductor substrate 2). By moving the support body 14 in the thickness direction D1, the mover 12 can change distances in the thickness direction D1 between the semiconductor substrate 2 and end faces of the gap portion 112, respectively.

For example, by moving the support body 14 in an upward direction D11, the mover 12 can reduce a distance in the thickness direction D1 between an upper end face 112*a* of the gap portion 112, which is a lower end face of an upper sidewall 111*a*, and the semiconductor substrate 2 and also can increase a distance in the thickness direction D1 between a lower end face 112*b* of the gap portion 112, which is an upper end face of a lower sidewall 111*b*, and the semiconductor substrate 2. On the other hand, by moving the support body 14 in a downward direction D12, the mover 12 can increase the distance in the thickness direction D1 between the upper end face 112*a* of the gap portion 112 and the semiconductor substrate 2 and also can reduce the distance in the thickness direction D1 between the lower end face 112*b* of the gap portion 112 and the semiconductor substrate 2.

By changing the distances between the semiconductor substrate 2 and the end faces of the gap portion 112, contact of the first outer edge portion 211 with the end faces of the gap portion 112 can be avoided even in a case where the first outer edge portion 211 warps in the thickness direction D1.

The mover 12 also can move the support body 14 in the horizontal direction D2. By moving the support body 14 in an insertion direction D21 which is leftward in FIG. 1 in the horizontal direction D2, the mover 12 can insert the first outer edge portion 211 to the inside of the reacting device 11 through the gap portion 112.

The mover 12 can include, for example, a motor and a driving-force transmission member such as a rack gear that converts a rotational motion of the motor into translational motions in the vertical direction D1 and the horizontal direction D2.

(Detecting Sensor 16)

The detecting sensor 16 faces a certain place of the outer edge portion 21 in the inside of the vacuum device 17, which is the outside of the reacting device 11. The detecting sensor 16 detects a warp amount of the outer edge portion 21 in the thickness direction D1. Due to rotation of the support body 14, respective places of the outer edge portion 21 are moved to a position facing the detecting sensor 16 in turn. Therefore, the detecting sensor 16 can detect warp amounts at the respective places of the outer edge portion 21 in turn with rotation of the support body 14.

The detecting sensor 16 can detect the warp amount of the outer edge portion 21, for example, based on a time from when light is irradiated toward the outer edge portion 21 to when reflection light from the outer edge portion 21 is received.

(Controller 13)

The controller 13 is connected to the mover 12 and controls the operation of the mover 12.

The controller 13 controls a movement amount of the semiconductor substrate 2 in the thickness direction D1 according to a warp amount of the outer edge portion 21 in the thickness direction D1 to prevent the outer edge portion 21 from hitting the end faces 112*a* and 112*b* of the gap portion 112. Specifically, the controller 13 executes control to move the support body 14 in the thickness direction D1 by a first movement amount corresponding to a warp amount of the first outer edge portion 211 when the support body 14 rotates in a state where the reacting device 11 houses the first outer edge portion 211. When the support body 14 is moved in the thickness direction D1 by the first movement amount, the controller 13 changes the first movement amount according to changes in the first outer edge portion 211 and the warp amount thereof associated with rotation of the support body 14. More specifically, the controller 13 calculates (detects) the first movement amount corresponding to each of the places of the outer edge portion 21 based on the warp amount of the outer edge portion 21 at the relevant place detected by the detecting sensor 16. The controller 13 then executes control to move the support body 14 in the thickness direction D1 by the first movement amount corresponding to each of the places when the relevant place becomes the first outer edge portion 211.

The controller 13 also executes control to move the support body 14 in the horizontal direction D2 by a second movement amount corresponding to the warp amount of the first outer edge portion 211 to keep an insertion amount of the first outer edge portion 211 to the inside of the reacting device 11 constant (a predetermined amount). The insertion amount of the first outer edge portion 211 can be a distance in the horizontal direction D2 between an outer end of the first outer edge portion 211 and the gap portion 112.

With the semiconductor manufacturing apparatus 1 according to the first embodiment, the movement amount of the semiconductor substrate 2 in the thickness direction D1 can be controlled according to the warp amount of the outer edge portion 21. Accordingly, hitting of the first outer edge portion 211 on the end faces of the gap portion 112 can be prevented to appropriately perform bevel etching and therefore to improve the yield of semiconductor devices.

Furthermore, because the semiconductor manufacturing apparatus 1 according to the first embodiment can control the movement amount of the semiconductor substrate 2 in the horizontal direction D2 according to the warp amount of the outer edge portion 21, the insertion amount of the first outer edge portion 211 can be controlled to be constant. Therefore, a substantially uniform etching amount can be stably provided regardless of the warp amount.

(Semiconductor Manufacturing Method)

Figure 3:
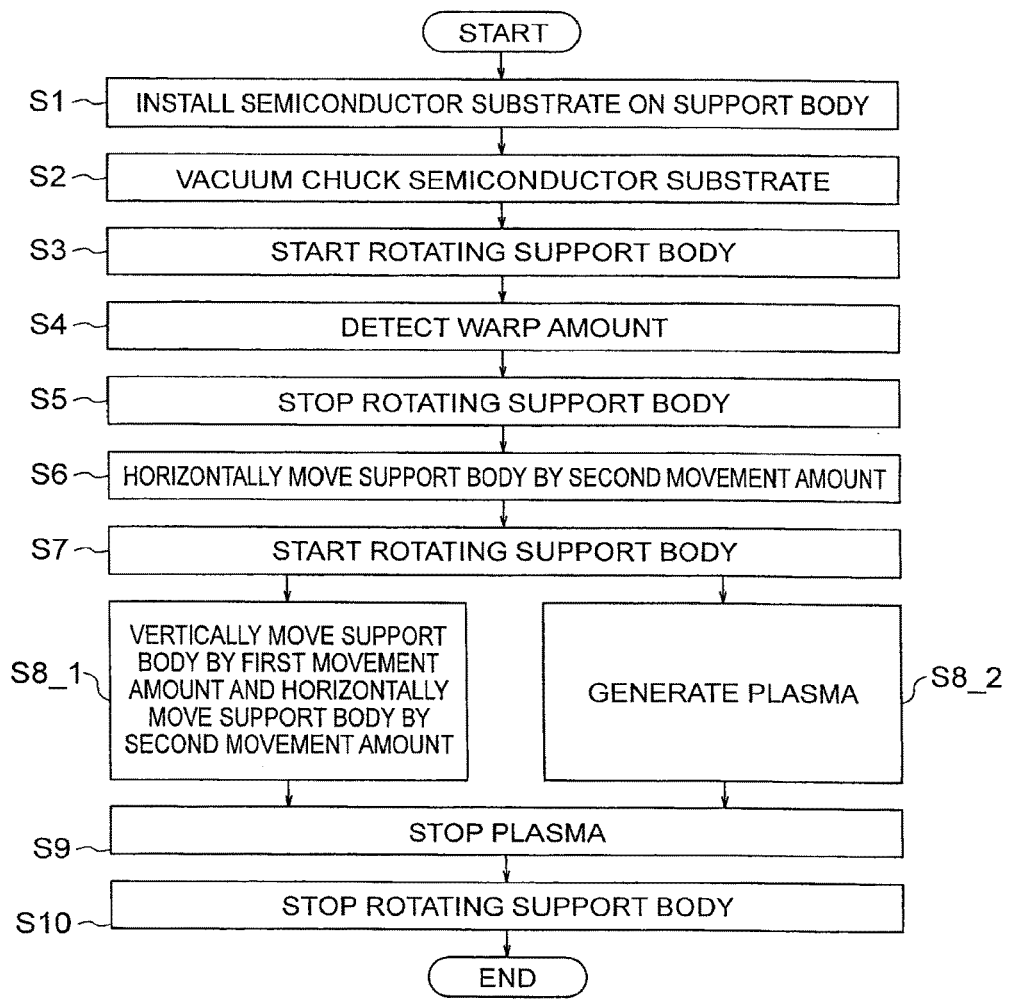
FIG. 3 is a flowchart showing a semiconductor manufacturing method according to the first embodiment.

A semiconductor manufacturing method to which the semiconductor manufacturing apparatus 1 in FIG. 1 is applied is explained next. FIG. 3 is a flowchart showing a semiconductor manufacturing method according to the first embodiment.

First, the semiconductor manufacturing apparatus 1 installs a semiconductor substrate 2 on the support body 14 using an automatic delivery mechanism (not shown) (Step S1).

Next, the support body 14 fixes the semiconductor substrate 2 with a vacuum chuck (Step S2).

Subsequently, the rotator 15 starts rotating the support body 14 (Step S3).

Figure 4:
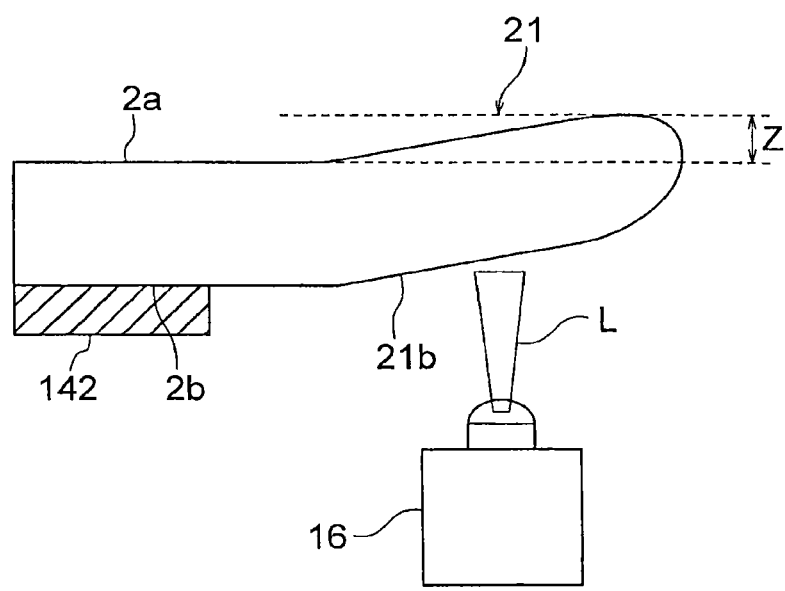
FIG. 4 is a schematic diagram showing the semiconductor manufacturing method according to the first embodiment.

After rotation of the support body 14 is started, the detecting sensor 16 detects warp amounts at respective places of the outer edge portion 21 of the semiconductor substrate 2 (Step S4). FIG. 4 is a schematic diagram showing the semiconductor manufacturing method according to the first embodiment. As shown in FIG. 4, the detecting sensor 16 can irradiate a rear surface 21b of the outer edge portion 21 with light L to detect the warp amount based on a time required until reflection light from the rear surface 21b is received. Although not limited thereto, the warp amount can be a distance Z between a surface (a front surface 2a in FIG. 4) on a warping direction side out of the front surface 2a and a rear surface 2b of the semiconductor substrate 2 and an end of the outer edge portion 21 on the warping direction side as shown in FIG. 4. The detecting sensor 16 can alternatively detect the warp amount using an index such as a notch 22 (see FIG. 2) provided at a specific position on the outer edge portion 21 as a reference position (a start position and an end position) for detecting the warp amount. The controller 13 records the warp amount detected by the detecting sensor 16 in a storage part to be associated with a relative position (a rotation angle, for example) with respect to the index (the reference position). The storage part can be a memory area in the controller 13 or an external storage device.

Next, the rotator 15 stops rotating the support body 14 at a time when detection of the warp amounts corresponding to one turn by the detecting sensor 16 is completed (Step S5). For example, the rotator 15 can stop rotating the support body 14 at a time when the detecting sensor 16 detects the index for the second time.

Next, the controller 13 extracts the warp amount corresponding to the first outer edge portion 211 from the storage part and calculates a second movement amount corresponding to the extracted warp amount. At that time, the controller 13 can extract the warp amount of the first outer edge portion 211 by specifying the first outer edge portion 211 based on a relative position from the index. Subsequently, the controller 13 inserts, that is, horizontally moves the first outer edge portion 211 to the inside of the reacting device 11 through the gap portion 112 by the calculated second movement amount (Step S6).

Next, the rotator 15 starts rotating the support body 14 in a state where the first outer edge portion 211 is housed in the inside of the reacting device 11 (Step S7).

Figure 5:
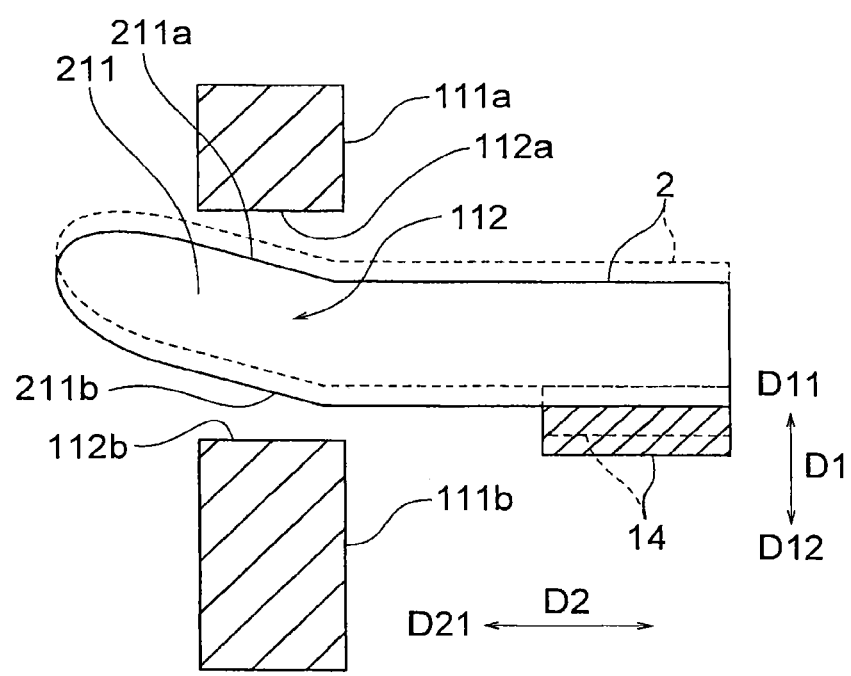
FIG. 5 is a schematic diagram showing the semiconductor manufacturing method according to the first embodiment.

FIG. 5 is a schematic diagram showing the semiconductor manufacturing method according to the first embodiment. In FIG. 5, the semiconductor substrate 2 and the support body 14 represented by dashed lines are the semiconductor substrate 2 and the support body 14 before moved in the downward direction D12. The semiconductor substrate 2 and the support body 14 represented by solid lines in FIG. 5 are the semiconductor substrate 2 and the support body 14 after moved in the downward direction D12.

After rotation of the support body 14 is started, the controller 13 acquires the warp amounts at respective places of the outer edge portion 21 from the storage part when the respective places become the first outer edge portion 211 in turn with rotation of the support body 14, and calculates the first movement amounts corresponding to the respective places based on the warp amounts. Subsequently, the controller 13 vertically moves the support body 14 by the first movement amounts corresponding to the respective places when the respective places become the first outer edge portion 211 (Step S8_1).

For example, when the first outer edge portion 211 warps in the upward direction D11 as shown in FIG. 5, the controller 13 calculates the first movement amount for moving the support body 14 in the downward direction D12 based on the warp amount. When the first outer edge portion 211 warps in the downward direction D12, the controller 13 can calculate the first movement amount for moving the support body 14 in the upward direction D11.

The first movement amount can be a movement amount that is the same as the warp amount of the first outer edge portion 211 and that is oriented in the opposite direction to the warping direction of the first outer edge portion 211. When the first movement amount is too large, the first outer edge portion 211 may hit the end face of the gap portion 112 on a side in the opposite direction to the warping direction while hitting of the first output edge portion 211 on the end face of the gap portion 112 on a warping direction side can be avoided. Therefore, it is desirable to calculate a movement amount in an appropriate range as the first movement amount to prevent the first outer edge portion 211 from hitting the either end face of the gap portion 112. For example, the first movement amount can be a movement amount that enables the semiconductor substrate 2 to move at a position where the minimum distance in the vertical direction D1 between an upper end face 211a of the first outer edge portion 211 and the upper end face 112a of the gap portion 112 and the minimum distance in the vertical direction D1 between a lower end face 211b of the first outer edge portion 211 and the lower end face 112b of the gap portion 112 are equal.

Subsequently, the controller 13 executes control to move the support body 14 in the downward direction D12 according to the calculated first movement amount as shown by the solid line portion in FIG. 5. By calculating the first movement amount to move the support body 14 in the downward direction D12 more largely when the first outer edge portion 211 warps in the upward direction D11 by a larger amount, the controller 13 can reliably prevent the first outer edge portion 211 from hitting the upper end face 112a of the gap portion 112.

When the support body 14 is vertically moved by the first movement amount, the controller 13 calculates a second movement amount based on the warp amount of the first outer edge portion 211 and horizontally moves the support body 14 by the calculated second movement amount (Step S8_1). The second movement amount (Step S8_1) after the semiconductor substrate 2 is inserted to the inside of the reacting device 11 can be smaller than the second movement amount when the semiconductor substrate 2 is inserted to the inside of the reacting device 11 (Step S6).

As the warp amount is larger, the insertion amount of the first outer edge portion 211 is smaller with respect to the movement amount of the support body 14 in the insertion direction D21. The controller 13 can keep the insertion amount of the first outer edge portion 211 constant by calculating the second movement amount to move the support body 14 more largely in the insertion direction D21 when the warp amount of the first outer edge portion 211 is larger. When a state where the warp amount is large changes to a state where the warp amount is small, it suffices to calculate the second movement amount for moving the support body 14 in a direction opposite to the insertion direction D21.

When the support body 14 is moved (Step S8_1), the reacting device 11 generates plasma P by exciting the gas G supplied from a gas source (not shown) with a microwave supplied from the microwave oscillator 18 (Step S8_2). The first outer edge portion 211 is thereby etched with the plasma P.

After etching of the entire periphery of the outer edge portion 21 is completed, the plasma P is stopped (Step S9) and rotation of the support body 14 is stopped (Step S10).

With the semiconductor manufacturing method according to the first embodiment, the bevel etching can be appropriately performed in the semiconductor manufacturing process and thus the yield of semiconductor devices can be improved.

Furthermore, after the warp amount is detected by the detecting sensor 16, the bevel etching reflecting the warp amount can be performed in the same apparatus 1. Therefore, an accurate movement amount of the support body 14 can be obtained based on an accurate warp amount just detected and including few time errors. Accordingly, the bevel etching can be performed more appropriately.

A plurality of modifications of the first embodiment are described below. In the descriptions of these modifications, constituent elements corresponding to those shown in FIG. 1 are denoted by like reference characters and redundant descriptions thereof will be omitted.

First Modification

Figure 6:
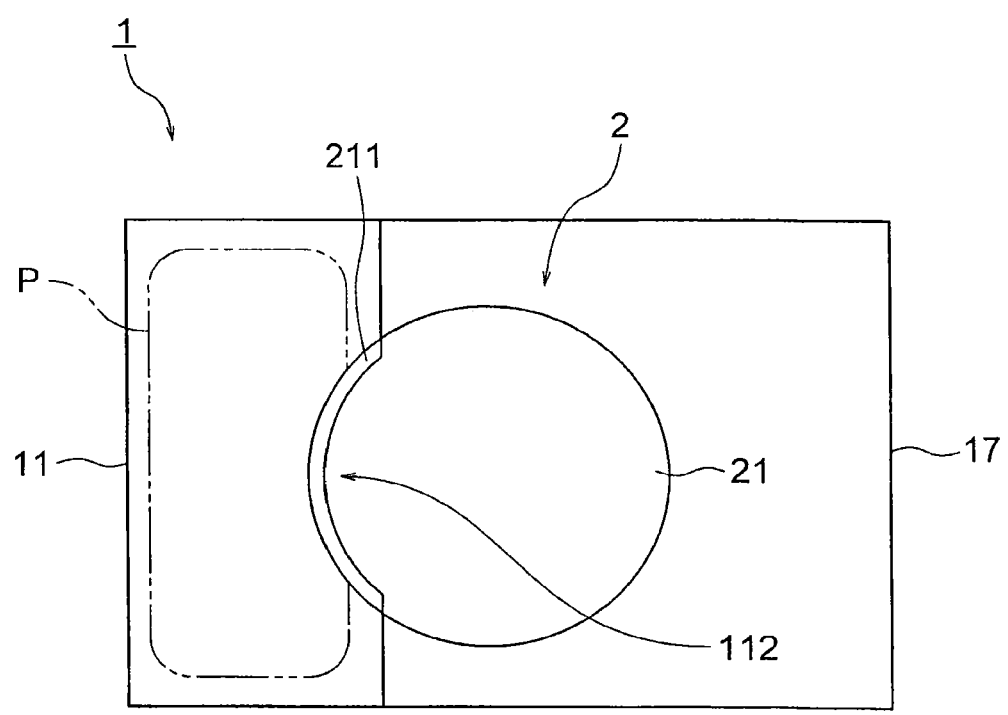
FIG. 6 is a schematic plan view showing a semiconductor manufacturing apparatus according to a first modification of the first embodiment.

FIG. 6 is a schematic plan view showing the semiconductor manufacturing apparatus 1 in which the shape of the gap portion 112 is changed as a first modification of the first embodiment. In FIG. 6, illustrations of constituent elements other than the gap portion 112 are simplified. In the semiconductor manufacturing apparatus 1 in FIG. 1, the gap portion 112 is linearly formed. In contrast, in the semiconductor manufacturing apparatus 1 according to the first modification, the gap portion 112 is formed like an arc. The arc-like gap portion 112 is closer to the shape of the outer edge portion 21 of the circular semiconductor substrate 2 than the linear gap portion 112. Accordingly, in the first modification, a range of the first outer edge portion 211 that can be etched at a time can be enlarged compared to the configuration shown in FIG. 1. The shape of the gap portion 112 can be variously changed according to the shape of the semiconductor substrate 2 as long as the gap portion 112 has an identical idea to that in the first modification. For example, for a rectangular semiconductor substrate 2, the gap portion 112 can be formed to have a rectangular shape.

With the semiconductor manufacturing apparatus 1 according to the first modification, the outer edge portion 21 can be efficiently etched and therefore the manufacturing efficiency of semiconductor devices can be improved.

Second Modification

Figure 7A:
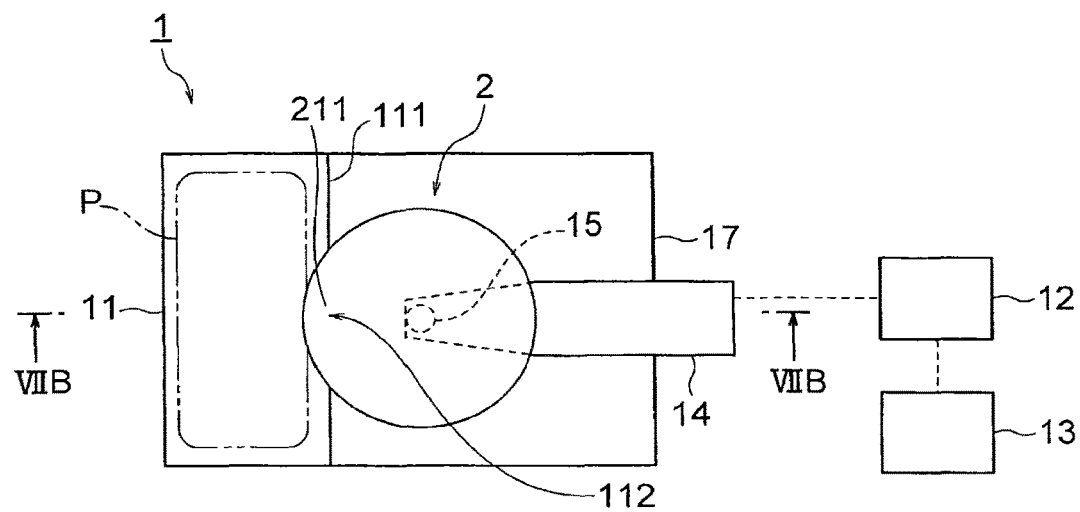
FIG. 7A is a schematic plan view showing a semiconductor manufacturing apparatus according to a second modification of the first embodiment.
Figure 7B:
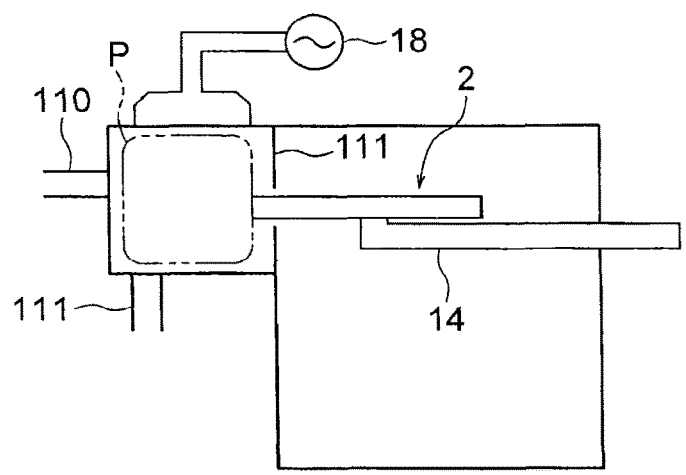
FIG. 7B is a cross-sectional view along a line VIIB-VIIB in FIG. 7A.

FIG. 7A is a schematic plan view showing the semiconductor manufacturing apparatus 1 in which the configuration of the support body 14 is changed as a second modification of the first embodiment. FIG. 7B is a cross-sectional view along a line VIIB-VIIB in FIG. 7A. In FIGS. 7A and 7B, illustrations of the detecting sensor 16 are omitted. As shown in FIGS. 7A and 7B, in the semiconductor manufacturing apparatus 1 according to the second modification, the support body 14 and the mover 12 function also as a delivery mechanism that delivers the semiconductor substrate 2 into the semiconductor manufacturing apparatus 1. The rotator 15 is provided at the leading end of the support body 14.

The semiconductor manufacturing apparatus 1 according to the second modification can use common parts as the mechanism that delivers the semiconductor substrate 2 to the semiconductor manufacturing apparatus 1 and the mechanism that moves the semiconductor substrate 2 in the inside of the semiconductor manufacturing apparatus 1 and therefore the number of components and the cost can be reduced.

Third Modification

Figure 8:
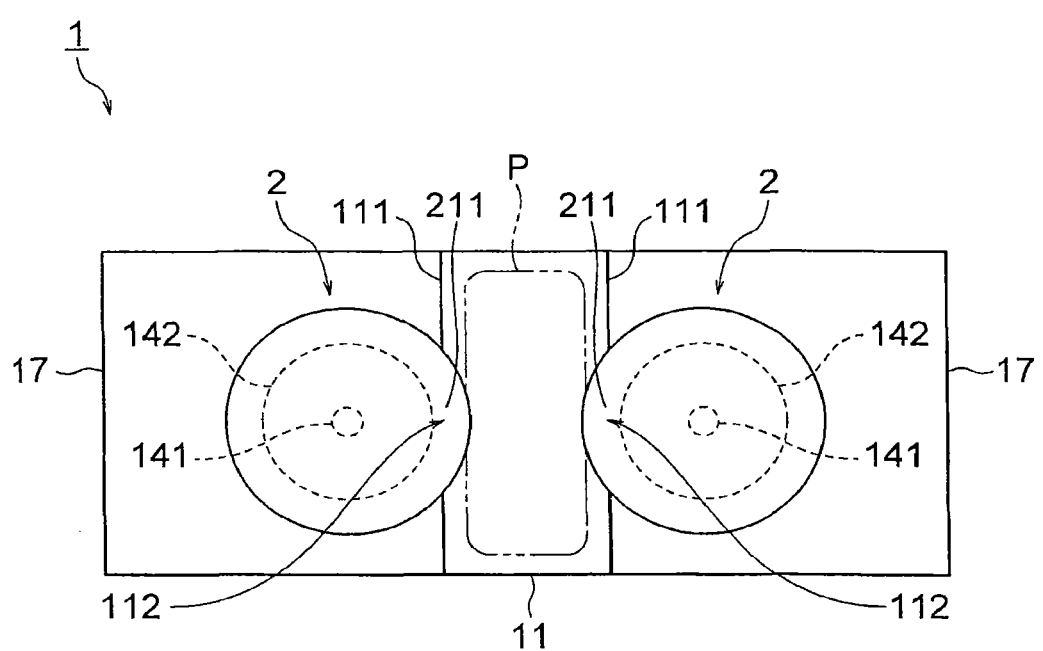
FIG. 8 is a schematic plan view showing a semiconductor manufacturing apparatus according to a third modification of the first embodiment.

FIG. 8 is a schematic plan view showing the semiconductor manufacturing apparatus 1 that can simultaneously process an increased number of semiconductor substrates 2 as a third modification of the first embodiment. In FIG. 8, illustrations of constituent elements other than vacuum devices 17 are simplified. In the semiconductor manufacturing apparatus 1 in FIG. 1, one semiconductor substrate 2 can be simultaneously etched by one reacting device 11. In contrast, in the semiconductor manufacturing apparatus 1 according to the third modification, two semiconductor substrates 2 can be simultaneously etched by one reacting device 11 as shown in FIG. 8.

Specifically, the semiconductor manufacturing apparatus 1 according to the third modification includes two vacuum devices 17 across the reacting device 11. Similarly to the semiconductor manufacturing apparatus 1 in FIG. 1, the mover 12, the controller 13, the support body 14, the rotator 15, and the detecting sensor 16 are provided in each of the vacuum devices 17. The reacting device 11 includes gap portions 112 communicated with the vacuum devices 17 in sidewalls 111 between the reacting device 11 and the vacuum devices 17, respectively. The semiconductor substrates 2 supported by the support bodies 14 in the respective insides of the vacuum devices 17 are housed by the movers 12 in the inside of the reacting device 11 through the corresponding gap portions 112 by movement amounts according to control of the controllers 13, respectively. The reacting device 11 then simultaneously etches the respective first outer edge portions 211 of the housed semiconductor substrates 2 with plasma P.

According to the third modification, the number of semiconductor substrates 2 that can be processed simultaneously can be increased and thus the throughput can be improved.

Fourth Modification

Figure 9:
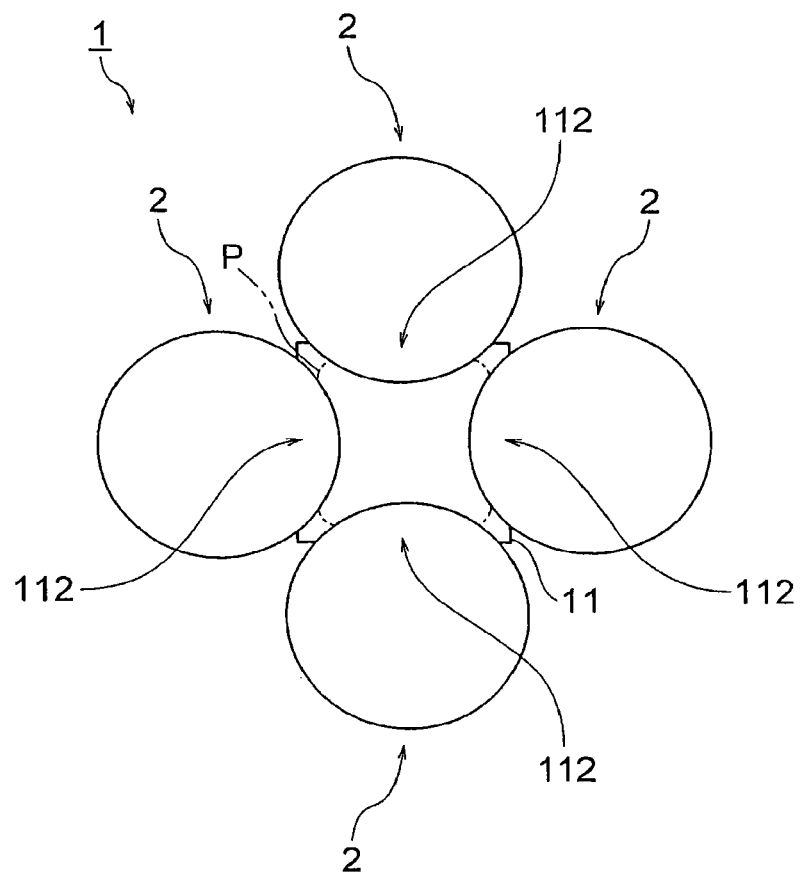
FIG. 9 is a schematic plan view showing a semiconductor manufacturing apparatus according to a fourth modification of the first embodiment.

FIG. 9 is a schematic plan view showing the semiconductor manufacturing apparatus 1 in which the number of semiconductor substrates 2 that can be processed simultaneously is further increased as a fourth modification of the first embodiment. In FIG. 9, illustrations of constituent elements other than the semiconductor substrates 2 are simplified. As shown in FIG. 9, it is also possible to form the gap portions 112 in four sidewalls of the reacting device 11 to enable four semiconductor substrates 2 to be simultaneously inserted to the inside of the reacting device 11 from four sides of the reacting device 11, respectively. Because four semiconductor substrates 2 can thus be processed simultaneously, the throughput can be improved more than that in the third modification.

There is a case where the entire region of the outer edge portion 21 has little warp. In this case, the sidewall 111 in the configuration shown in FIG. 1 can be moved in the horizontal direction D2 (rightward in FIG. 1) to simultaneously expose the entire region of the outer edge portion 21 to the plasma P. This can further improve the throughput. Furthermore, the sidewall 111 can be moved upward or downward to control the distances between the semiconductor substrate 2 and the end faces of the gap portion 112 based on the first movement amount.

Second Embodiment

An embodiment of a semiconductor manufacturing apparatus that moves end faces of a gap portion in the thickness direction of a semiconductor substrate is explained next as a second embodiment. In the second embodiment, constituent elements corresponding to those described in the first embodiment are denoted by like reference characters and redundant descriptions thereof will be omitted.

Figure 10:
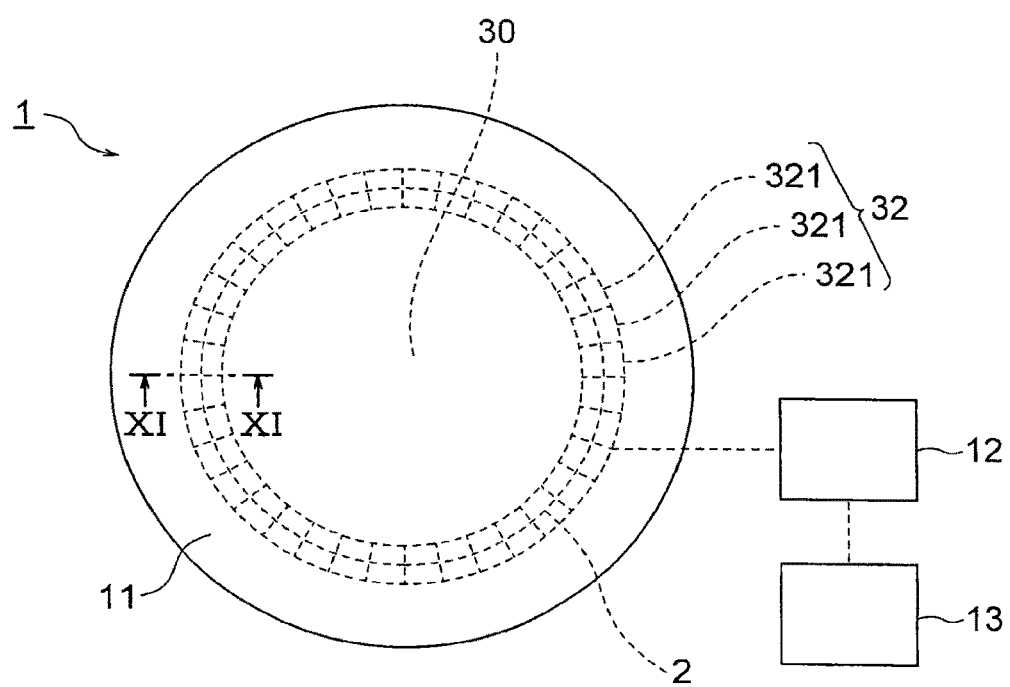
FIG. 10 is a schematic plan view showing a semiconductor manufacturing apparatus according to a second embodiment.
Figure 11A:
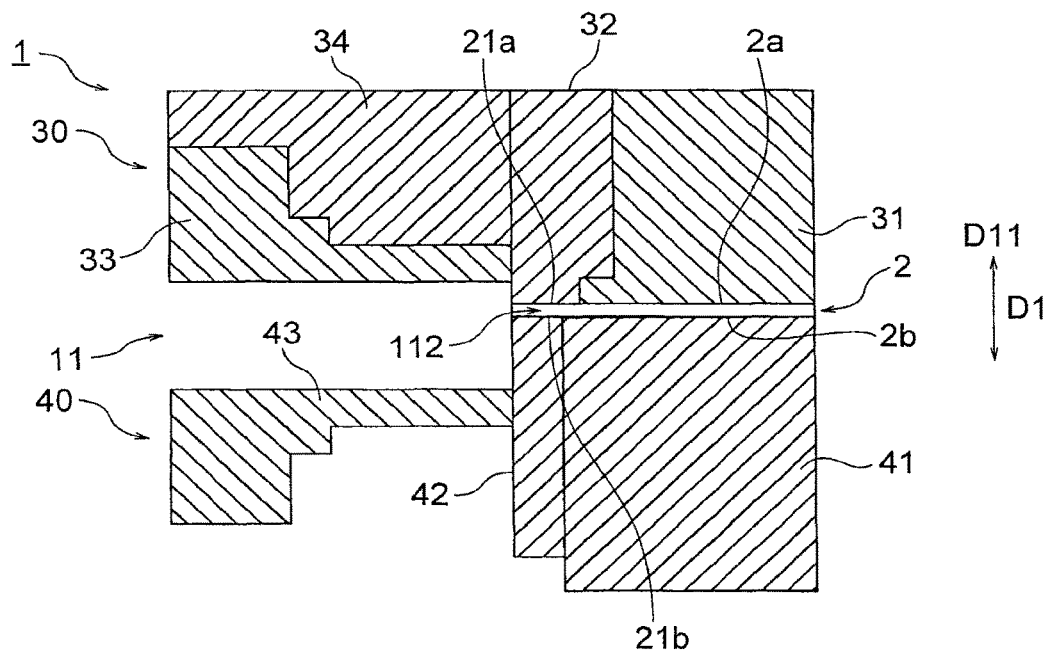
FIGS. 11A and 11B are cross-sectional views along a line XI-XI in FIG. 10.
Figure 11B:
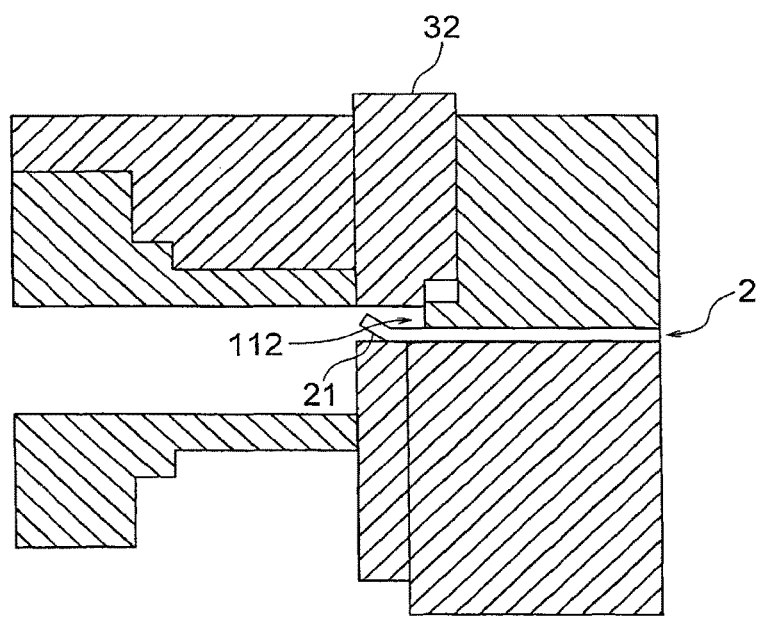

FIG. 10 is a schematic plan view showing the semiconductor manufacturing apparatus 1 according to the second embodiment. FIGS. 11A and 11B are cross-sectional views along a line XI-XI in FIG. 10. FIG. 11A shows the semiconductor manufacturing apparatus 1 in a case where the outer edge portion 21 has little warp and FIG. 11B shows the semiconductor manufacturing apparatus 1 in a case where the outer edge portion 21 has warp. As shown in FIG. 10, the semiconductor manufacturing apparatus 1 according to the second embodiment includes the reacting device 11 of an annular shape that surrounds the entire periphery of a semiconductor substrate 2.

As shown in FIGS. 11A and 11B, the semiconductor manufacturing apparatus 1 includes an upper electrode 30 and a lower electrode 40 for generating the plasma P in the inside of the reacting device 11 in a vacuum state.

The upper electrode 30 is an example of a first electrode. As shown in FIGS. 11A and 11B, the upper electrode 30 includes an upper dielectric plate 31, an upper ring 32 as an example of a first electrode portion, an upper annular electrode 33, and an upper metallic component 34. The upper dielectric plate 31 faces the front surface (the upper surface) 2a of the semiconductor substrate 2. The upper dielectric plate 31 can be formed of, for example, ceramics. The upper ring 32 surrounds the upper dielectric plate 31 and faces a front surface 21a of the outer edge portion 21 of the semiconductor substrate 2. The upper annular electrode 33 surrounds the upper ring 32. The upper annular electrode 33 can be formed of, for example, aluminum. The upper dielectric plate 31, the upper ring 32, and the upper annular electrode 33 are attached to the upper metallic component 34. The upper metallic component 34 can be formed of, for example, metal such as aluminum. The upper electrode 30 can be moved upward or downward as a whole by a moving mechanism (not shown).

The lower electrode 40 is an example of a second electrode. As shown in FIGS. 11A and 11B, the lower electrode 40 includes a lower electrode plate 41, a lower ring 42 as an example of a second electrode portion, and a lower annular electrode 43. The lower electrode plate 41 faces the rear surface (the lower surface) 2b of the semiconductor substrate 2. The lower ring 42 surrounds the lower electrode plate 41 and faces the rear surface 21b of the outer edge portion 21. The lower annular electrode 43 surrounds the lower ring 42 and is opposite to the upper annular electrode 33. The lower annular electrode 43 can be formed of, for example, aluminum.

In FIGS. 11A and 11B, illustrations of a structure that supplies gas to the inside of the reacting device 11 are omitted.

The gap portion 112 in the second embodiment is the gap portion 112 between the upper ring 32 and the lower ring 42. The gap portion 112 is formed circularly to be capable of housing the entire periphery of the outer edge portion 21 in the inside of the reacting device 11.

As shown in FIG. 10, the upper ring 32 is divided into a plurality of division portions 321 along the circumferential direction of the gap portion 112.

The mover 12 moves the upper ring 32 having an end face of the gap portion 112 in the thickness direction D1 of the semiconductor substrate 2.

The controller 13 controls the movement amount of the upper ring 32 in the thickness direction D1 according to the warp amount of the outer edge portion 21 in the thickness direction D1 of the semiconductor substrate 2. At that time, the controller 13 controls the movement amount of the upper ring 32 with respect to each of the division portions 321. The mover 12 thereby moves the division portions 321 individually by movement amounts according to warp amounts of the outer edge portion 21 corresponding to the positions of the division portions 321, respectively.

With the semiconductor manufacturing apparatus 1 according to the second embodiment, hitting of the first outer edge portion 211 on the end face of the gap portion 112 can be prevented by moving the end face of the gap portion 112 and the bevel etching can be appropriately performed similarly in the first embodiment.

The entire upper electrode 30 can be moved upward or downward to control the distance between the semiconductor substrate 2 and the end face of the gap portion 112.

(Semiconductor Manufacturing Method)

Figure 12:
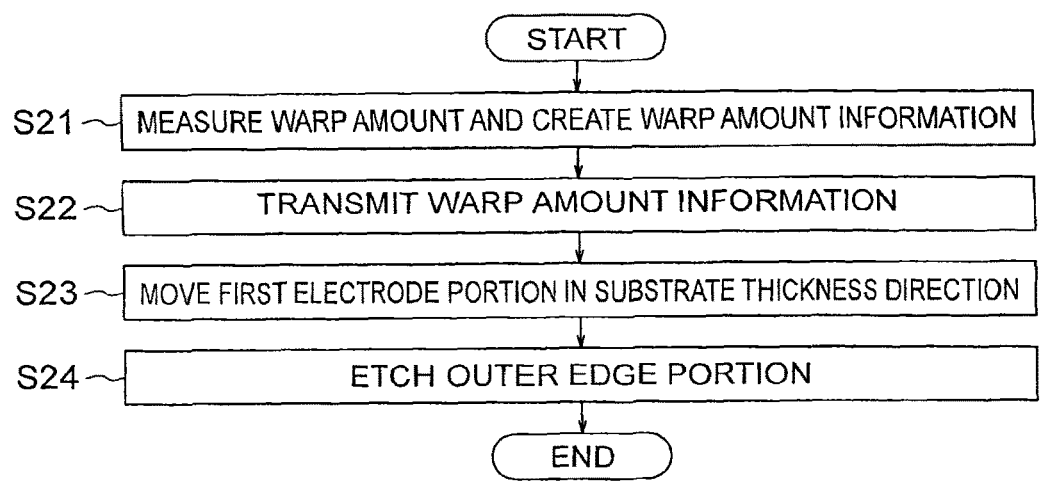
FIG. 12 is a flowchart showing a semiconductor manufacturing method according to the second embodiment.

A semiconductor manufacturing method to which the semiconductor manufacturing apparatus 1 shown in FIGS. 11A and 11B is applied is explained next. FIG. 12 is a flowchart showing a semiconductor manufacturing method according to the second embodiment.

First, the warp amount of the outer edge portion 21 of the semiconductor substrate 2 is measured by a measuring apparatus (not shown) and warp amount information is created (Step S21). Measurement of the warp amount can be performed, for example, by optically detecting a difference in curvature radii in the semiconductor substrate 2.

The warp amount information is information indicating the warp amounts of respective places of the outer edge portion 21. Although not limited thereto, the warp amount information can be, for example, information including the warp amounts linked with circumferential distances from the position of the notch 22 on a wafer, respectively.

Next, the warp amount information is transmitted from the measuring apparatus to the controller 13 (Step S22). Around the time of transmission of the warp amount information, the semiconductor substrate 2 is installed in the semiconductor manufacturing apparatus 1. At the time of installation of the semiconductor substrate 2, the lower electrode 40 can fix the semiconductor substrate 2 with a vacuum chuck.

Subsequently, the controller 13 calculates the movement amount of the upper ring 32 according to the warp amount information with respect to each of the division portions 321 and executes control to move the upper ring 32 in the thickness direction D1 of the semiconductor substrate 2 by the calculated movement amount (Step S23). For example, the controller 13 can set the movement amount of the upper ring 32 in the upward direction D11 at a larger value in a case where the warp amount of the outer edge portion 21 in the upward direction D11 is large (see FIG. 11B) than in a case where there is almost no warp amount (see FIG. 11A).

Next, the plasma P is generated and the outer edge portion 21 is etched (Step S24).

With the semiconductor manufacturing method according to the second embodiment, the bevel etching can be performed appropriately in the semiconductor manufacturing process and therefore the yield of semiconductor devices can be improved similarly in the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method of etching an outer edge portion of a semiconductor substrate using a semiconductor manufacturing apparatus comprising a reactor, the method comprising:
    acquiring a warp amount of the outer edge portion of the semiconductor substrate;
    housing the outer edge portion in inside of the reactor through a gap portion causing the inside and outside of the reactor to be communicated with each other;
    moving at least either the semiconductor substrate or end faces of the gap portion in a thickness direction of the semiconductor substrate by a movement amount according to the warp amount to control distances in the thickness direction between the semiconductor substrate and the end faces of the gap portion; and
    etching the outer edge portion in a state where the distances in the thickness direction are controlled.

2. The method of claim 1, wherein
    the gap portion is provided in a sidewall separating the inside and the outside of the reactor from each other,
    housing the outer edge portion is housing a first outer edge portion of the outer edge portion in a certain range of an entire periphery of the outer edge portion,
    moving the semiconductor substrate in the thickness direction by a movement amount according to the warp amount is rotating a supporter supporting the semiconductor substrate and moving the supporter in the thickness direction by a first movement amount according to a warp amount of the first outer edge portion, and
    the first movement amount is changed according to changes in the first outer edge portion and a warp amount thereof with rotation of the supporter.

3. The method of claim 2, wherein
    acquiring the warp amount is detecting warp amounts of a plurality of places of the outer edge portion in turn at a detection position facing a certain place of the outer edge portion according to rotation of the outer edge portion along with rotation of the supporter, and
    moving the supporter by a first movement amount according to a warp amount of the first outer edge portion is detecting the first movement amounts corresponding to the places of the outer edge portion based on the warp amounts of the places of the outer edge portion and moving the supporter by the first movement amounts corresponding to the places when the places become the first outer edge portion, respectively.

4. The method of claim 2, further comprising inserting the first outer edge portion to the inside of the reactor through the gap portion by moving the supporter horizontally, wherein
    inserting the first outer edge portion is moving the supporter horizontally by a second movement amount according to a warp amount of the first outer edge portion to control an insertion amount of the first outer edge portion to a predetermined amount.

5. The method of claim 4, wherein acquiring the warp amount is detecting warp amounts of a plurality of places of the outer edge portion in turn at a detection position facing a certain place of the outer edge portion according to rotation of the outer edge portion along with rotation of the supporter, and
    moving the supporter by a second movement amount according to a warp amount of the first outer edge portion is detecting the second movement amounts corresponding to the places based on the warp amounts of the places and moving the supporter by the second movement amounts corresponding to the places when the places become the first outer edge portion, respectively.

6. The method of claim 1, wherein
    the semiconductor manufacturing apparatus comprises a first electrode facing a front surface of the semiconductor substrate, and a second electrode facing a rear surface of the semiconductor substrate,
    the gap portion is provided between a first electrode portion facing a front surface of the outer edge portion in the first electrode and a second electrode portion facing a rear surface of the outer edge portion in the second electrode,
    the reactor houses an entire periphery of the outer edge portion, and
    moving an end face of the gap portion in the thickness direction by a movement amount according to the warp amount is moving the first electrode portion or the first electrode.

7. The method of claim 6, wherein
    the first electrode portion is divided into a plurality of division portions along the gap portion, and
    moving an end face of the gap portion is moving the division portions independently.

8. The method of claim 1, wherein the etching is etching using plasma in a vacuum state.

\* \* \* \* \*